(12) United States Patent
Ishida et al.

(10) Patent No.: US 7,659,766 B2
(45) Date of Patent: Feb. 9, 2010

(54) SEMICONDUCTOR INTEGRATED CIRCUIT DEVICE ENABLING TO PRODUCE A STABLE CONSTANT CURRENT EVEN ON A LOW POWER-SOURCE VOLTAGE

(75) Inventors: Hideki Ishida, Kawasaki (JP); Megumi Oono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 471 days.

(21) Appl. No.: 11/004,807

(22) Filed: Dec. 7, 2004

(65) Prior Publication Data

US 2005/0083031 A1 Apr. 21, 2005

Related U.S. Application Data

(62) Division of application No. 10/613,123, filed on Jul. 7, 2003, now Pat. No. 6,844,773.

(30) Foreign Application Priority Data

Jul. 26, 2002 (JP) ............................. 2002-218433

(51) Int. Cl.
*H03L 5/00* (2006.01)
(52) U.S. Cl. ................................................. 327/333
(58) Field of Classification Search ................. 326/80, 326/81; 327/319, 333; 330/252, 253, 257, 330/261
See application file for complete search history.

(56) References Cited

U.S. PATENT DOCUMENTS

| | | | |
|---|---|---|---|
| 4,904,953 A | 2/1990 | McCormack | |
| 5,132,560 A | 7/1992 | Kane et al. | |
| 5,198,782 A | 3/1993 | Scott et al. | |
| 5,455,816 A * | 10/1995 | Bitting | 360/67 |
| 5,515,003 A | 5/1996 | Kimura | |
| 5,670,910 A | 9/1997 | Kato | |
| 5,696,440 A | 12/1997 | Hirada | |
| 5,764,086 A * | 6/1998 | Nagamatsu et al. | 327/65 |
| 5,898,341 A * | 4/1999 | Miyashita | 330/253 |
| 6,034,519 A | 3/2000 | Yang | |
| 6,081,108 A | 6/2000 | Marshall et al. | |
| 6,348,835 B1 | 2/2002 | Sato et al. | |
| 6,535,030 B1 * | 3/2003 | Nix | 327/65 |
| 6,653,900 B2 * | 11/2003 | Bu | 330/253 |
| 6,727,753 B2 * | 4/2004 | Moon | 330/253 |
| 6,731,169 B2 * | 5/2004 | Tsukagoshi et al. | 330/253 |
| 6,741,130 B2 * | 5/2004 | Wey et al. | 330/253 |
| 6,756,847 B2 * | 6/2004 | Blecker et al. | 330/253 |
| 6,774,720 B2 * | 8/2004 | Ikeda et al. | 330/253 |
| 6,774,721 B1 * | 8/2004 | Popescu et al. | 330/253 |
| 6,798,290 B2 * | 9/2004 | Groe et al. | 330/254 |

FOREIGN PATENT DOCUMENTS

JP 03-217915 A 9/1991

\* cited by examiner

*Primary Examiner*—Jeffrey S Zweizig
(74) *Attorney, Agent, or Firm*—Arent Fox LLP

(57) ABSTRACT

A semiconductor integrated circuit device has a first MIS transistor of a first conductivity type, a second MIS transistor of a second conductivity type, a resistor connected in series between a first power-source line and a second power-source line, and a third MIS transistor of the first conductivity type. The third MIS transistor has a gate connected to a node where the first MIS transistor and the second MIS transistor are connected together, and a drain connected to a connection node where the second MIS transistor and the resistor are connected together.

7 Claims, 11 Drawing Sheets

SEMICONDUCTOR INTEGRATED CIRCUIT DEVICE ENABLING TO PRODUCE A STABLE CONSTANT CURRENT EVEN ON A LOW POWER-SOURCE VOLTAGE

CROSS REFERENCE TO RELATED APPLICATION

This application is a division of prior application Ser. No. 10/613,123 filed Jul. 7, 2003, now U.S. Pat. No. 6,844,773, which is based upon and claims the benefit of priority from the prior Japanese Patent Application No. 2002-218433, filed on Jul. 26, 2002, the entire contents of which are incorporated herein by reference.

BACKGROUND OF THE INVENTION

1. Field of the Invention

The present invention relates to a semiconductor integrated circuit device, and more particularly, to an analog circuit device that requires a stable constant-current source.

2. Description of the Related Art

It is a modern trend to fabricate semiconductor integrated circuit devices that operate at ever high speeds while consuming a constant amount of electric power, while efforts have been made to lower the power-source voltage and to decrease the amplitude of the signals. This trend also applies even to the semiconductor integrated circuit devices constituted by MOS (metal oxide semiconductor or, more broadly, metal insulator semiconductor) transistors or to the analog circuit devices constituted by a CMOS (complementary MOS) circuit that requires a stable constant-current source. Therefore, it has been required to provide a semiconductor integrated circuit device that is capable of producing a stable constant current even on a low power-source voltage.

Further, it has been required to provide a level-shifting circuit capable of operating at high speeds to serve as an interface between a modern semiconductor integrated circuit device that work on a low power-source voltage (e.g., 1.8 V, 1.2 V or lower) to produce signals of a small amplitude and a conventional semiconductor integrated circuit device that work on a high power-source voltage (e.g., 3.3 V or 2.5 V) to produce signals of a large amplitude.

The prior art and its associated problem will be described in detail later with reference to relevant drawings.

SUMMARY OF THE INVENTION

An object of the present invention is to provide a semiconductor integrated circuit device having a current source which is capable of equally copying a stable electric current affected by neither the power-source voltage nor the drain voltage. Another object of the present invention is to provide a semiconductor integrated circuit device having a level-shifting function capable of coping with high-frequency inputs of small amplitudes over a wide range and of converting the input signals into signals of a predetermined logic voltage.

According to the present invention, there is provided a semiconductor integrated circuit device having a first MIS transistor of a first conductivity type, a second MIS transistor of a second conductivity type, and a resistor connected in series between a first power-source line and a second power-source line, comprising a third MIS transistor of the first conductivity type having a gate connected to a node where the first MIS transistor and the second MIS transistor are connected together, and a drain connected to a connection node where the second MIS transistor and the resistor are connected together.

The semiconductor integrated circuit device may further comprise fourth and fifth MIS transistors of the second conductivity type current mirror-connected to the second MIS transistor; a sixth MIS transistor of the first conductivity type connected between the fourth transistor and to the first power-source line, and is current mirror-connected to the first MIS transistor; and a seventh MIS transistor of the first conductivity type connected between the fifth MIS transistor and to the first power-source line, and a gate of the seventh MIS transistor being connected to a node where the first MIS transistor and the second MIS transistor are connected together.

The semiconductor integrated circuit device may further comprise an eighth MIS transistor of the first conductivity type having a source connected to the first power-source line, and a gate connected to a node where the first MIS transistor and second MIS transistor are connected together, in order to produce an output current. The semiconductor integrated circuit device may further comprise a ninth MIS transistor of the second conductivity type connected between the second MIS transistor and the resistor; and tenth and eleventh MIS transistors of the second conductivity type connected between the second power-source line and the fourth and fifth MIS transistors, wherein the ninth, tenth and eleventh MIS transistors are connected to the second, fourth and fifth MIS transistors in cascade.

The first MIS transistor may have characteristics different from those of other MIS transistors of the first conductivity type. The first MIS transistor having different characteristics may be of a size smaller than those of the other MIS transistors of the first conductivity type. The first MIS transistor having different characteristics may be of a threshold voltage higher than those of the other MIS transistors of the first conductivity type. The first MIS transistor having different characteristics may give a substrate bias larger than those of the other MIS transistors of the first conductivity type.

Further, according to the present invention, there is provided a semiconductor integrated circuit device having an amplifier unit which receives input signals and is constituted by high-voltage MIS transistors of a first conductivity type and a second conductivity type, and a level-shifting unit which receives the output from the amplifier unit and produces a signal of a level that is shifted, wherein the amplifier unit comprises diode-connected high-voltage MIS transistors of the second conductivity type; and the level-shifting unit comprises high-voltage MIS transistors of the second conductivity type current mirror-connected to the diode-connected high-voltage MIS transistors of the second conductivity type, as well as low-voltage MIS transistors of the first conductivity type and of the second conductivity type.

The diode-connected high-voltage MIS transistors of the second conductivity type may be replaced by resistors. The high-voltage MIS transistors of the second conductivity type may be connected in a crossing manner to the diode-connected high-voltage MIS transistors of the second conductivity type. The amplifier unit may comprise a pair of high-voltage MIS transistors of the first conductivity type for receiving differential input signals. The amplifier unit may further comprise a pair of high-voltage MIS transistors of the first conductivity type having cross-connected drains, for the pair of high-voltage MIS transistors of the first conductivity type to receive the input signals.

The amplifier unit may comprise a first differential pair of high-voltage MIS transistors of a first conductivity type for receiving differential input signals; and a second differential pair of high-voltage MIS transistors of a second conductivity type for receiving the differential input signals.

According to the present invention, there is also provided a semiconductor integrated circuit device having a current-source circuit, and a differential amplifier circuit, an output current of the current-source circuit through a current mirror circuit being a bias voltage of a current source in the differential amplifier circuit, wherein the current-source circuit comprises a first MIS transistor of a first conductivity type; a second MIS transistor of a second conductivity type; a resistor connected in series between a first power-source line and a second power-source line; and a third MIS transistor of the first conductivity type having a gate connected to a node where the first MIS transistor and the second MIS transistor are connected together, and a drain connected to a connection node where the second MIS transistor and the resistor are connected together; and the differential amplifier circuit having an amplifier unit which receives input signals and is constituted by high-voltage MIS transistors of a first conductivity type and a second conductivity type, and a level-shifting unit which receives the output from the amplifier unit and produces a signal of a level that is shifted, wherein the amplifier unit comprises diode-connected high-voltage MIS transistors of the second conductivity type; and the level-shifting unit comprises high-voltage MIS transistors of the second conductivity type current mirror-connected to the diode-connected high-voltage MIS transistors of the second conductivity type, as well as low-voltage MIS transistors of the first conductivity type and of the second conductivity type.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Prior to describing the semiconductor integrated circuit device of embodiments of the present invention in detail, described below with reference to FIGS. 1 to 4, first, are conventional semiconductor integrated circuit devices and their problems.

Fundamentally, the current-source circuit has heretofore been so designed as to produce a stable electric current without affected by the power-source voltage, process or temperature.

Figure 1:
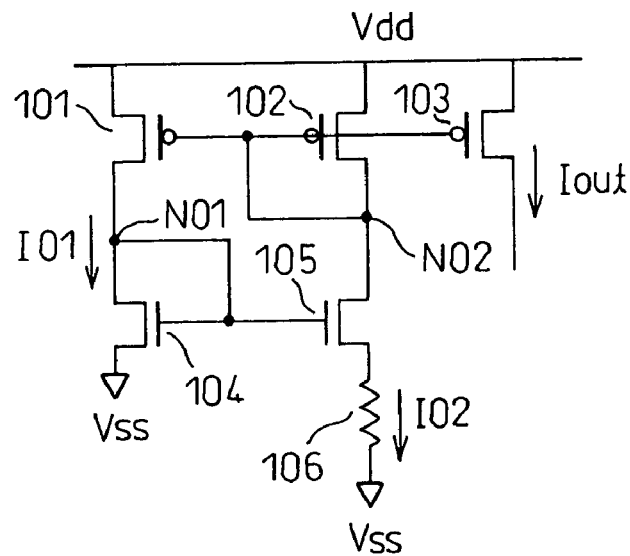
FIG. 1 is a circuit diagram illustrating a conventional semiconductor integrated circuit device.

FIG. 1 is a circuit diagram illustrating a conventional integrated circuit device or a current-source circuit which is not affected by the power source. In FIG. 1, reference sign Vdd denotes a high-potential power-source line (high-potential power-source voltage), Vss denotes a low-potential power-source line (low-potential power-source voltage), 101 to 103 denote p-channel MOS transistors (pMOS transistors), 104 and 105 denote n-channel MOS transistors (nMOS transistors), and 106 denotes a resistor.

It is now presumed that the circuit shown in FIG. 1 is an ideal current source, that the resistor 106 has a resistance R and that the low-potential power-source voltage Vss is 0 V. First, the transistor 101 and the transistor 102 are current mirror-connected and, hence, there holds I01=I02. Further, if the gate-source voltage of the transistor 104 is denoted by Vgs01, the current amplification factor thereof by $\beta_{01}$, the gate-source voltage of the transistor 105 by Vgs02, the current amplification factor thereof by $K\beta_{01}$, and if it is presumed that the transistors 104 and 105 have an equal threshold voltage Vth, then, the current I01 that flows through the transistor 104 becomes $01=\beta_{01}(Vgs01-Vth)^2/2$. Further, there holds Vgs01=Vgs02+I02·R.

If the threshold voltage Vth is erased from the above formulas, the current Iout that flows through the transistor 103 current mirror-connected to the transistor 102, becomes Iout=I01=I02=$2/\beta1 \cdot 1/R^2 \cdot (1-1/\sqrt{K})^2$. Thus, the power-source voltage is not included in the formula, and it can be said that the circuit is not affected by the power-source voltage. Upon current mirror-connecting the transistors to the transistor 102 like the transistor 105, a current similar to the current Iout can be copied as required.

Figure 2:
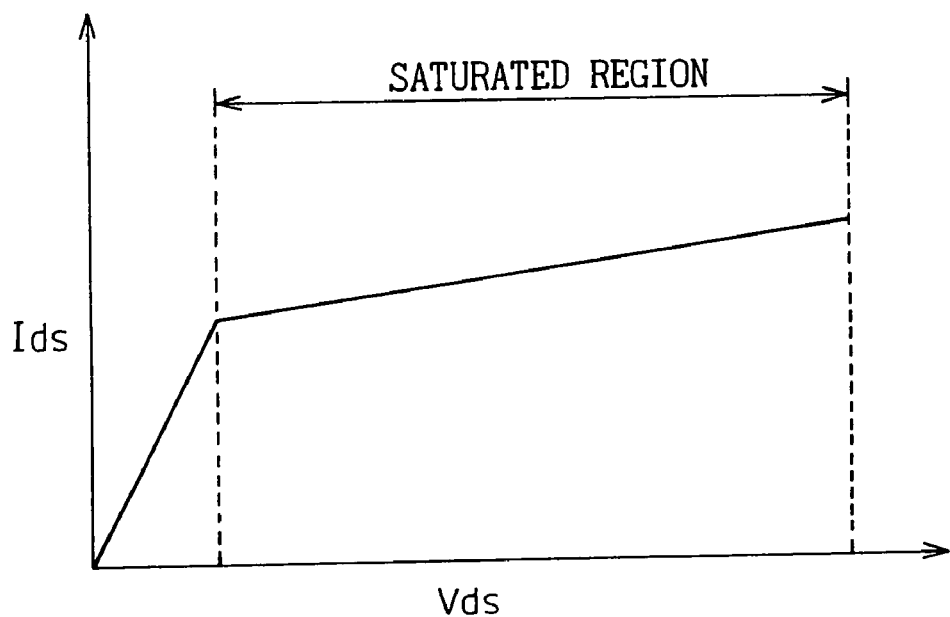
FIG. 2 is a diagram schematically illustrating the Vds-Ids characteristics of a transistor.

FIG. 2 is a diagram schematically illustrating the Vds-Ids characteristics of the transistor.

There exist characteristics shown in FIG. 2 between the source-drain voltage Vds and the drain current (source-drain current) Ids of the transistor and, in practice, there exists an inclination even in the saturated region. If the power source voltage (Vdd) increases, therefore, the source-drain voltage Vds of the transistors 101 and 102 increase resulting in an increase in the electric current. Further, if the power-source voltage decreases, the source-drain voltage Vds of the transistors 101 and 102 decreases resulting in a decrease in the electric current, or the current may enter into a linear region.

Therefore, a drop in the voltage varies through the transistors 104 and 105, and a voltage V01 at a node N01 becomes different from a voltage V02 at a node N02. By taking this as well as the resistance component Rds between the source and the drain of the transistor 105 into consideration, the current becomes I02=I01+(V02−V01)/Rds. Therefore, I02≠I01, and the current value is not equally mirrored. It is further probable that error may result from mismatching in the threshold voltage Vth and current amplification factor β of the transistors.

That is, there remains a probability in that the conventional current source circuit shown in FIG. 1 is affected by the power-source voltage, and is further much affected by the temperature and the process. When the power-source voltage can be maintained to some extent, further, the precision in the current source can be improved by vertically stacking the transistors. Accompanying the modern trend for finely fabricating the transistors and increasing the operation speed, however, the power-source voltage has been lowered, and the conventional method is becoming no longer capable of coping with the matters. Further, the inclination of saturated region is increasing in the current characteristics making it more difficult to design a stable current source. Besides, the current source is becoming essential even in the amplifier that is capable of receiving high frequencies. Without the current stabilized, it is difficult to obtain the output of the amplifier maintaining a frequency as intended.

The input signals that have now been stipulated under the Standards are, in many cases, set to be higher than a modern power-source voltage which has been set to be low. To cope with this, there are used two kinds of power-source voltages (Vdd1: higher high-potential power-source voltage such as 3.3 V or 2.5 V, and Vdd2: lower high-potential power-source voltage such as 1.8 V or 1.2 V), and differential input signals (IN, /IN) are received by a differential pair of transistors pMOS and nMOS.

Figure 3:
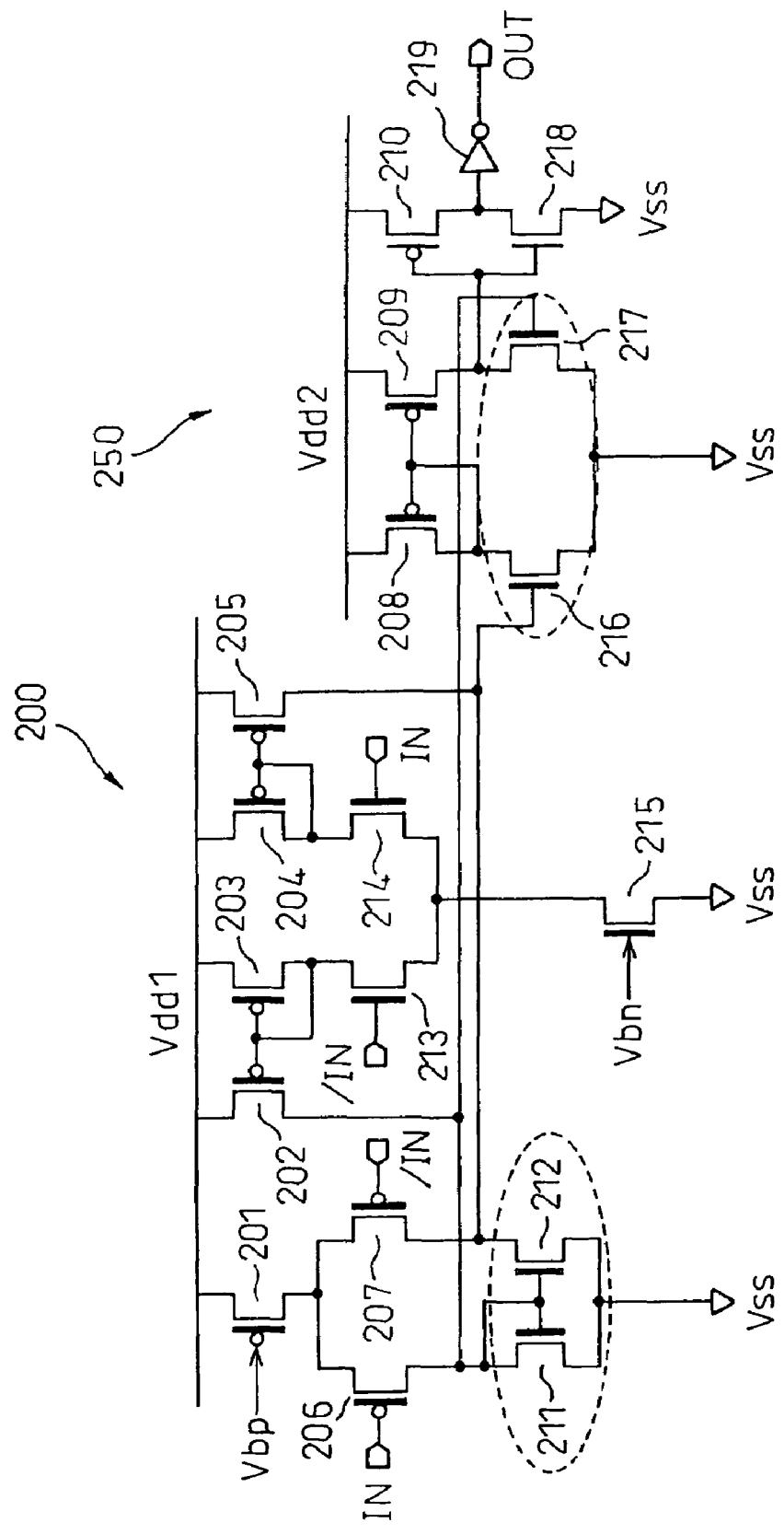
FIG. 3 is a circuit diagram illustrating another conventional semiconductor integrated circuit device.

FIG. 3 is a circuit diagram illustrating another conventional semiconductor integrated circuit device or a differential amplifier equipped with a conventional level-shifting function. In FIG. 3, reference numeral 200 denotes a differential amplifier unit, 250 denotes a level-shifting unit, 201 to 210 denote pMOS transistors, 211 to 218 denote nMOS transistors, and 219 denotes an inverter. Further, reference sign Vdd1 denotes a higher high-potential power-source voltage (e.g., 3,3 V or 2.5 V), Vdd2 denotes a lower high-potential power-source voltage (e.g., 1.8 V or 1.2 V), and Vss denotes a low-potential power source voltage (e.g., 0 V). Further, the pMOS transistors 201 to 209 and the nMOS transistors 211 to 217 are the MOS transistors for high-voltage use, and the pMOS transistor 210 and nMOS transistor 218 are the MOS transistors for low-voltage use.

Namely, as shown in FIG. 3, the conventional semiconductor integrated circuit device (differential amplifier equipped with the level-shifting function) includes a differential amplifier unit 200 to which the higher high-potential power-source voltage Vdd1 is applied and having pMOS transistors 201 to 207 and nMOS transistors 211 to 215, and a level-shifting unit 250 to which the lower high-potential power-source voltage Vdd2 is applied and having PMOS transistors 208 to 210, nMOS transistors 216 to 218 and the inverter 219.

The differential input signals IN, /IN are fed to a differential pair of pMOS transistors 206 and 207, as well as to a differential pair of nMOS transistors 214 and 213 to maintain a dynamic range of input signals. The differentially amplified signals are fed to the gates of NMOS transistors 216 and 217 in the level-shifting unit 250. Here, though the lower high-potential power-source voltage Vdd2 has been applied to the level-shifting unit 250, the nMOS transistors 216, 217 and the pMOS transistors 208, 209 that receive the output signal of the differential amplifier unit 200, are for high-voltage use, and the pMOS transistor 210 and the nMOS transistor 218 constituting the inverter of the next stage are for low-voltage use. Thus, the level-shifting unit 250 shifts the level of the output signal of the differential amplifier unit 200 to obtain an output corresponding to the power-source voltage that has been lowered.

In the semiconductor integrated circuit device shown in FIG. 3, however, the gain becomes too great in the differential amplifier unit 200, the output of the differential amplifier unit 200 becomes higher than the power-source voltage (Vdd2) in the level-shifting unit 250, and the output of the level-shifting unit 250 is inverted requiring a time that corresponds to a voltage (Vdd1−Vdd2); i.e., time is wasted and the operation becomes slow. Further, the level-shifting unit 250 has no current source and permits a through current to flow, arousing a problem even from the standpoint of power consumption.

Figure 4:
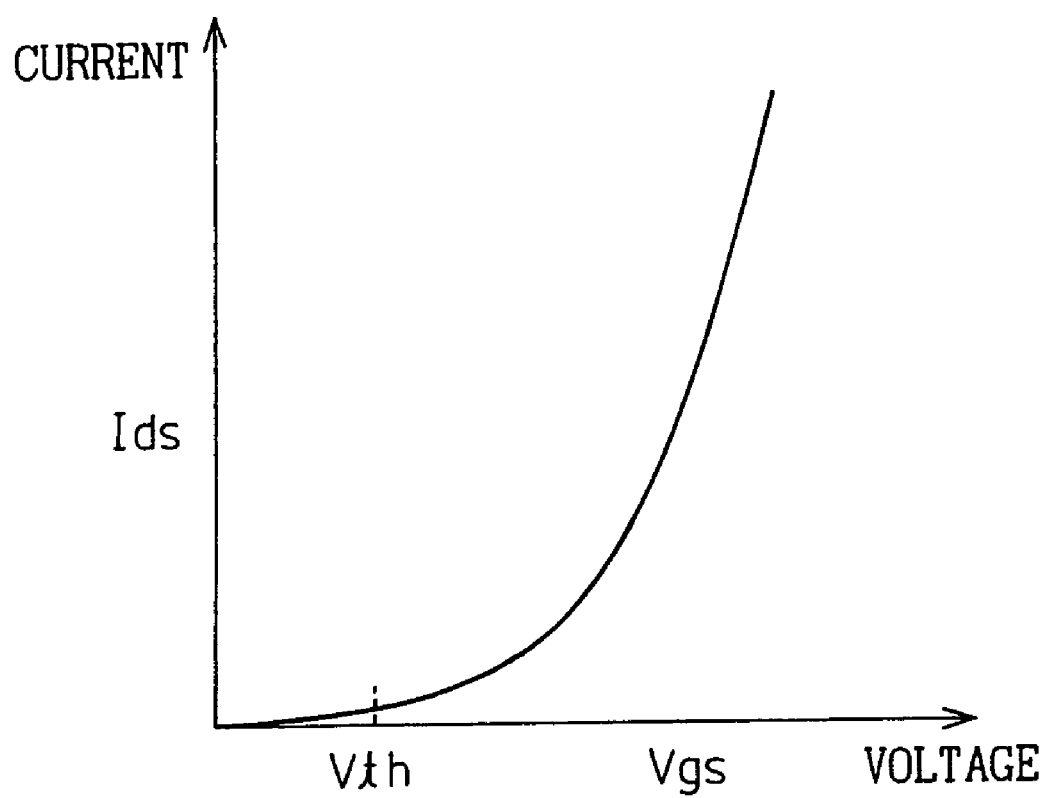
FIG. 4 is a diagram schematically illustrating the Vgs-Ids characteristics of a transistor.

FIG. 4 is a diagram schematically illustrating the Vgs-Ids characteristics of a transistor.

As shown in FIG. 4, further, when the power-source voltage is lowered, the gate-source voltage Vgs decreases even in the high-voltage transistors (208, 209) other than the input differential pair of transistors (216, 217) in the level-shifting unit 250 since their threshold voltage Vth is high. Therefore, the electric current does not flow as intended, and a high-speed operation cannot be accomplished.

Embodiments of the semiconductor integrated circuit device according to the present invention will now be described in detail with reference to the accompanying drawings.

Figure 5:
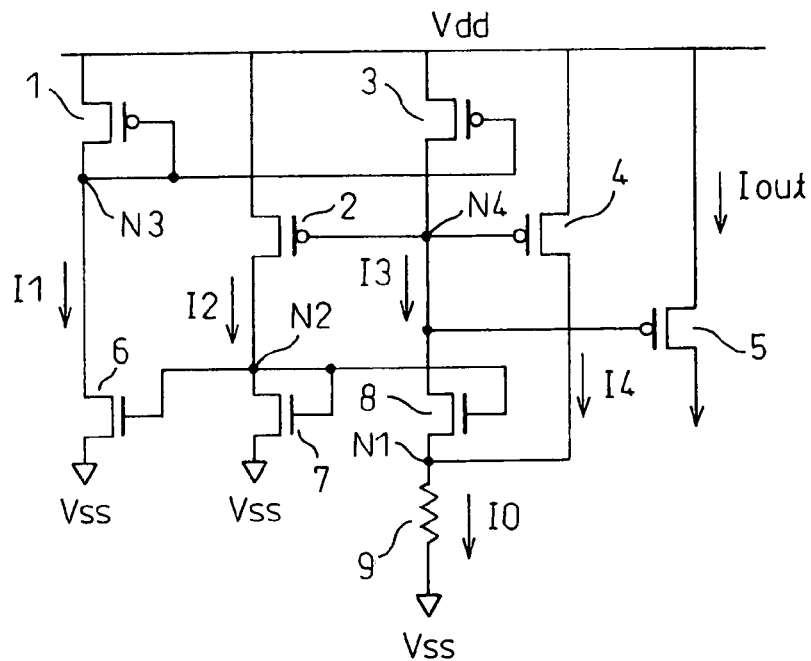
FIG. 5 is a circuit diagram illustrating a semiconductor integrated circuit device according to a first embodiment of the present invention.

FIG. 5 is a circuit diagram illustrating a semiconductor integrated circuit device according to a first embodiment of the present invention. In FIG. 5, reference sign Vdd denotes a high-potential power-source line (high-potential power-source voltage), Vss denotes a low-potential power-source line (low-potential power-source voltage), 1 to 5 denote pMOS (MIS) transistors, 6 to 8 denote nMOS (MIS) transistors, and 9 denotes a resistor. The current source circuit (semiconductor integrated circuit device) shown in FIG. 5 is not almost affected by changes in the power-source voltage and in the temperature in contrast with the conventional current-source circuit described with reference to FIG. 1.

Referring to FIG. 5, the current-source circuit according to the first embodiment includes a resistor 9 connected to the low-potential power-source line Vss to flow a current I0, an nMOS transistor 8 connected to the low-potential power-source line Vss through the resistor 9, nMOS transistors 6 and 7 current mirror-connected to the nMOS transistor 8, a pMOS transistor 1 connected to the nMOS transistor 6 and to the high-potential power-source line Vdd, a pMOS transistor 3 current mirror-connected to the pMOS transistor 1 and is connected to the nMOS transistor 8 and to the high-potential power-source line Vdd, a pMOS transistor connected to the nMOS transistor 7 and to the high-potential power-source line Vdd, a pMOS transistor 4 current mirror-connected to the pMOS transistor 2, and a pMOS transistor 5 connected at its source to the high-potential power-source line Vdd. Gates of the nMOS transistors 6, 7 and 8 are connected to a connection node N2 of the pMOS transistor 2 and the nMOS transistor 7, the drain of the nMOS transistor 7 is connected to a connection node N1 of the nMOS transistor 8 and the resistor 9, gates of the pMOS transistors 2 and 4 are connected to a connection node N4 of the nMOS transistor 8 and the pMOS transistor 3, and the connection node N4 of the nMOS transistor 8 and the pMOS transistor 3 is connected to the gate of the pMOS transistor 5, to mirror the electric current.

As for the Vds-Ids characteristics of the transistor, the current does not become constant even in the saturated region but is inclined as described above with reference to FIG. 2;

i.e., inclined to a predetermined degree. Therefore, an increase in the potential of the power-source voltage (Vdd) is accompanied by an increase in the currents I1, I2, I3, I4, I5 and Iout. Next, since the current I4 increases, the potential V1 increases at the node N1. Accordingly, Vgs of the transistor 8 becomes shallow to decrease the current, making it possible to suppress an increase in the current caused by a change in the power source. It is similarly made possible to suppress even the current caused by a change in the temperature.

Further, a current produced by the transistor 2 works to stabilize the current flowing through the transistor 7→transistor 6→transistor 3. Due to this feedback, there is constituted a more stable current source. Employment of this circuit establishes a stable current source without vertically stacking the transistors, which can be used even when the power-source voltage is low.

Further, the threshold voltage Vth of the transistor varies depending upon the temperature, and the current value varies, too. By utilizing a low portion in the gate-source voltage Vgs of the transistor, however, there occurs almost no change in the threshold voltage Vth of the transistor, and the current source is not almost affected by the temperature.

As described above, it can be said that the current-source circuit (semiconductor integrated circuit device) of the first embodiment is a stable current source of which the power-source voltage is not almost affected by the temperature.

Figure 6:
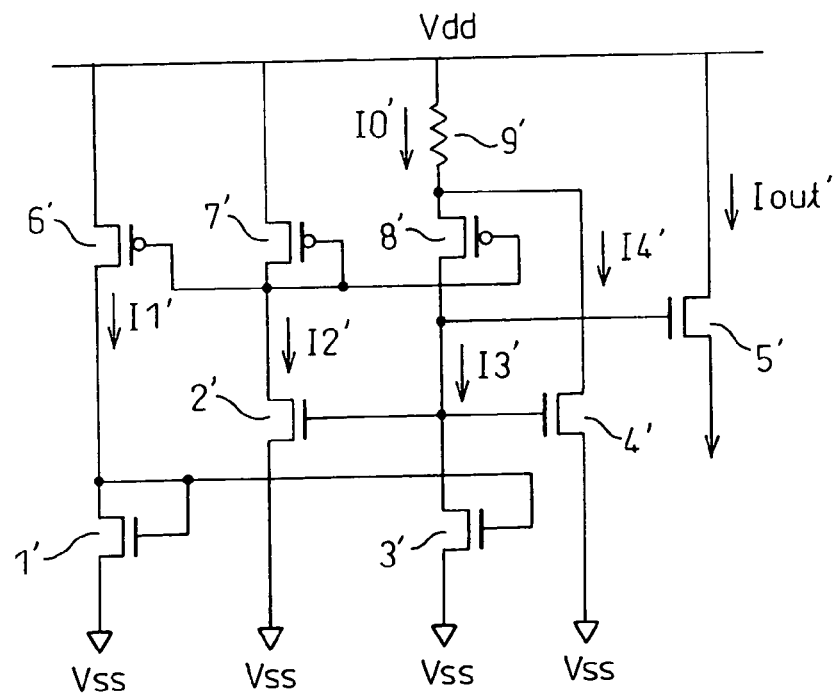
FIG. 6 is a circuit diagram illustrating a modified example of the semiconductor integrated circuit device shown in FIG. 5.

FIG. 6 is a circuit diagram illustrating a modified example of the semiconductor integrated circuit device of FIG. 5.

As will be obvious from the comparison of FIG. 5 with FIG. 6, the modified example shown in FIG. 6 is the one in which the pMOS transistors 1 to 5 in the first embodiment of FIG. 5 are replaced by nMOS transistors 1' to 5', the nMOS transistors 6 to 8 are replaced by PMOS transistors 6' to 8', the high-potential power-source line Vdd is replaced by the low-potential power-source line Vss, and the low-potential line power-source Vss is replaced by the high-potential power-source line Vdd. In the modified example of FIG. 6, further, the currents I0 to I4 and Iout in the first embodiment of FIG. 5 are corresponding to currents I0' to I4' and Iout'. In the modified example of FIG. 6, the resistor 9' is connected between the high-potential power-source line Vdd and the source of the pMOS transistor 8.

Figure 7:
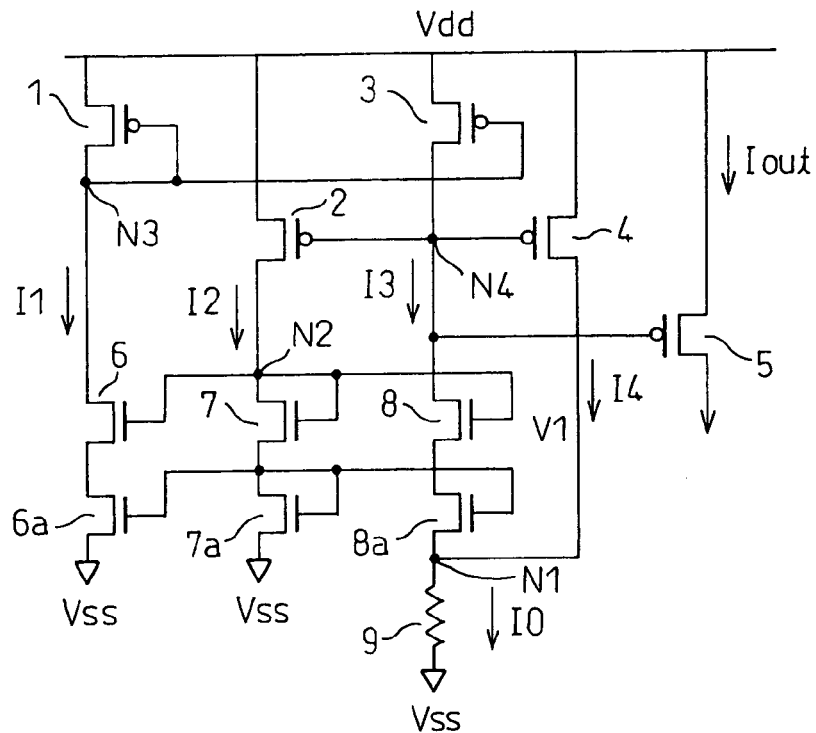
FIG. 7 is a circuit diagram illustrating the semiconductor integrated circuit device according to a second embodiment of the present invention.

FIG. 7 is a circuit diagram illustrating the semiconductor integrated circuit device according to a second embodiment of the present invention.

Referring to FIG. 7, the current-source circuit(semiconductor integrated circuit device) according to the second embodiment has nMOS transistors 6a, 7a and 8a that are added to the current-source circuit of the first embodiment shown in FIG. 5, the nMOS transistor 6a being arranged between the source of the nMOS transistor 6 and the low-potential power-source line Vss, the nMOS transistor 7a being arranged between the source of the nMOS transistor 7 and the low-potential power-source line Vss, and the nMOS transistor 8a being arranged between the source of the nMOS transistor 8 and the resistor 9 (node N1).

That is, in the current-source circuit of the second embodiment, the nMOS transistors 6a, 7a and 8a are connected in cascade to the nMOS transistors 6, 7 and 8 in the current-source circuit of the first embodiment of FIG. 5 to increase the output resistance in an attempt to supply the electric current more stably than in the current-source circuit of FIG. 5. However, the current-source circuit of the second embodiment must have a power-source voltage (Vdd) which is great to some extent (e.g., about 3.3 V). The current-source circuit of the first embodiment of FIG. 5 can be used to a sufficient degree even when the power-source voltage (Vdd) is, for example, about 1.2 V.

Figure 8:
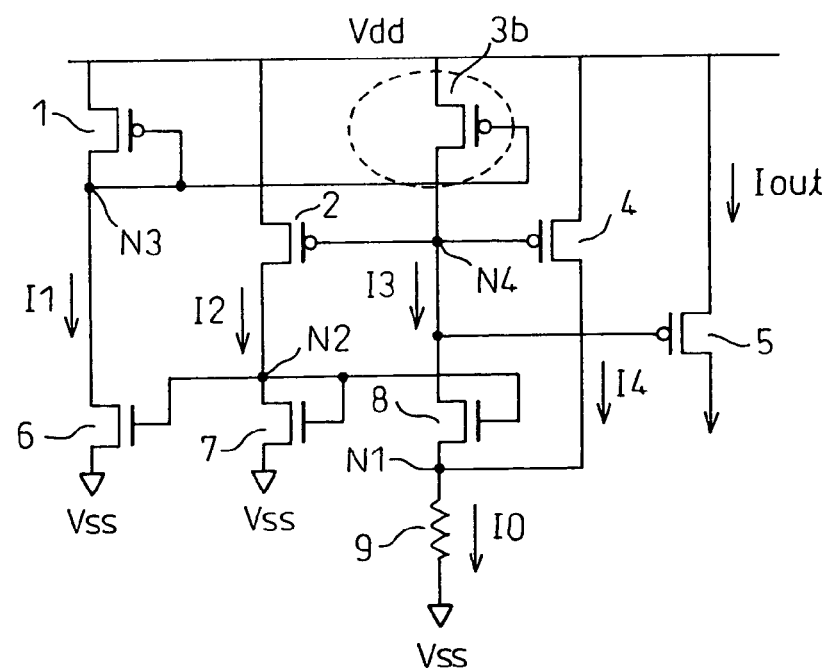
FIG. 8 is a circuit diagram illustrating the semiconductor integrated circuit device according to a third embodiment of the present invention.

FIG. 8 is a circuit diagram illustrating the semiconductor integrated circuit device according to a third embodiment of the present invention. As shown in FIG. 8, the current-source circuit of the third embodiment is constituted in the same manner as the one of the first embodiment shown in FIG. 5. In the first embodiment, the pMOS transistor 3 is the same as the other pMOS transistors 1, 2, 4 and 5. In the current-source circuit of the third embodiment shown in FIG. 8, however, the pMOS transistor 3 is constituted by a different kind of pMOS transistor 3b.

Namely, in the third embodiment, the pMOS transistor 3b arranged between the high-potential power-source line Vdd and the node N4, may have a threshold voltage Vthb larger than the threshold voltage Vth of other pMOS transistors 1, 2, 4 and 5 to decrease the current I3, or may operate at a low speed (normal operation speed) when other pMOS transistors 1, 2, 4 and 5 are high-speed transistors, or may give a substrate bias deeper than the substrate bias (bias voltage applied to the well) of other pMOS transistors 1, 2, 4 and 5.

By selecting the threshold voltage Vthb of the pMOS transistor 3b to be larger than the threshold voltage Vth of other pMOS transistors 1, 2, 4 and 5 as described above, it is allowed to decrease (adjust) the current I3(I0) and to stably supply the output current Iout.

As described above, the current-source circuit (semiconductor integrated circuit device) of the embodiments of the present invention is not almost affected by the power-source voltage, is little affected by the temperature, and is capable of stably supplying a current to cope with a decrease in the power-source voltage stemming from the modern transistors that have been fabricated ever finely.

Figure 9:
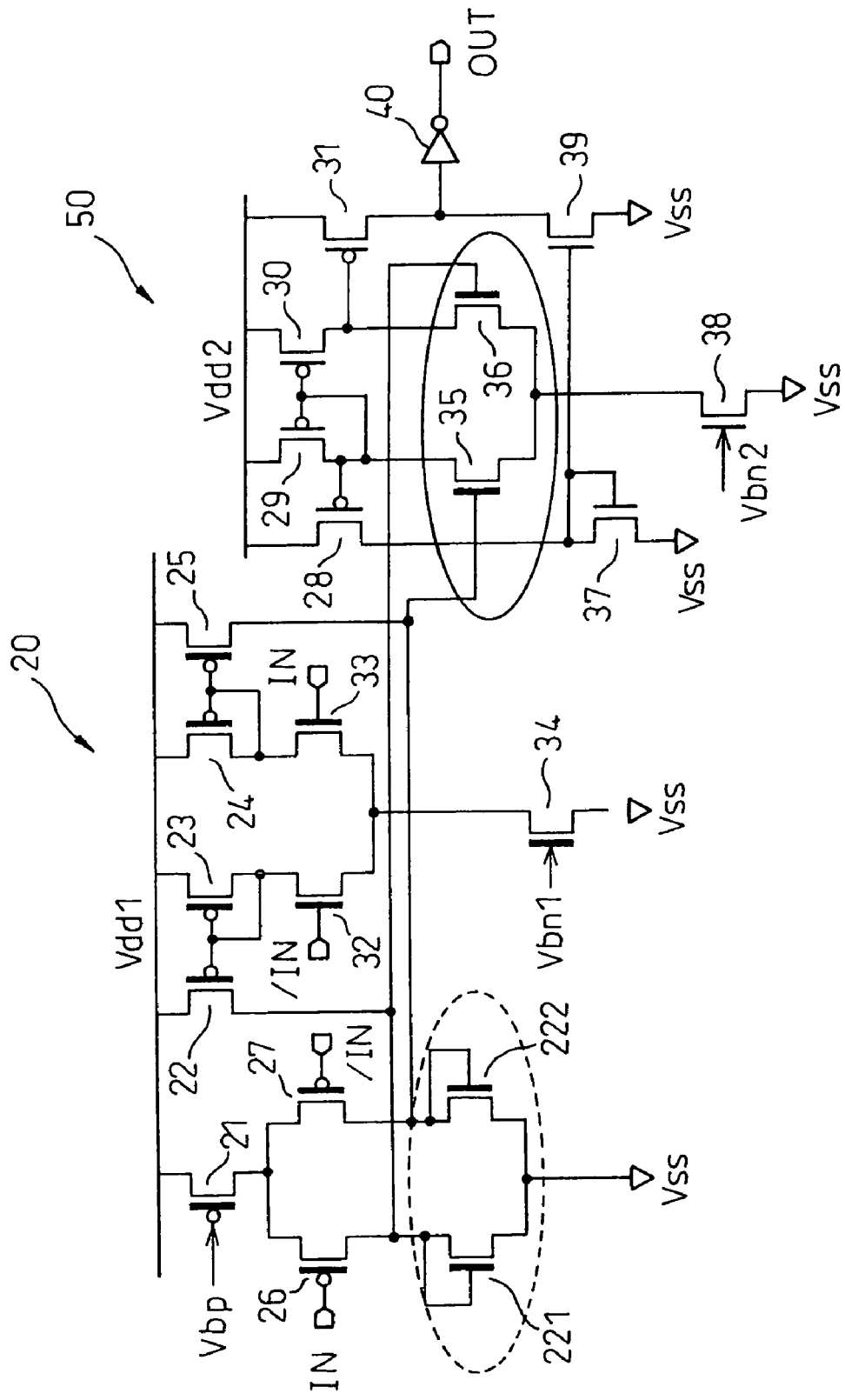
FIG. 9 is a circuit diagram illustrating the semiconductor integrated circuit device according to a fourth embodiment of the present invention.

FIG. 9 is a circuit diagram illustrating the semiconductor integrated circuit device according to a fourth embodiment of the present invention, or illustrating a differential amplifier equipped with a level-shifting function which copes with input signals of an input level of small amplitudes at high frequencies over a wide range, and outputs the input signals while shifting their level into a voltage of a logic level. In FIG. 9, reference numeral 20 denotes a differential amplifier unit, 50 denotes a level-shifting unit, 21 to 31 denote pMOS transistors, 32 to 39 and 221, 222 denote nMOS transistors, and 40 denotes an inverter. Further, reference sign Vdd1 denotes a higher high-potential power-source voltage (e.g., 3.3 V or 2.5 V), Vdd2 denotes a lower high-potential power-source voltage (e.g., 1.8 V or 1.2 V), and Vss denotes a low-potential power-source voltage (e.g., 0 V). Here, the pMOS transistors 21 to 27 and nMOS transistors 32 to 36 and 221, 222 are for high-voltage use, and pMOS transistors 28 to 31 and nMOS transistors 37 to 39 are for low-voltage use.

That is, as shown in FIG. 9, the semiconductor integrated circuit device (differential amplifier equipped with a level-shifting function) of the fourth embodiment includes the differential amplifier unit 20 to which is applied the higher high-potential power-source voltage Vdd1 and having pMOS transistors 21 to 27 and nMOS transistors 32 to 34 and 221, 222, and the level-shifting unit 50 to which is applied the lower high-potential power-source voltage Vdd2 and having pMOS transistors 28 to 31, nMOS transistors 35 to 39 and the inverter 40.

According to the fourth embodiment as will be obvious from the comparison of FIG. 3 with FIG. 9, the nMOS transistors 221 and 222 (corresponds to nMOS transistors 211 and 212 in FIG. 3) in the differential amplifier unit 20 are diode-connected, and are current mirror-connected to the nMOS transistors 36 and 35 in the level-shifting unit 50. Here, in the level-shifting unit 50, the nMOS transistors 35 and 36 only are constituted by the MOS transistors for high-voltage use, and the other pMOS transistors 28 to 31 and nMOS transistors 37 to 39 are constituted by the MOS transistors for low-voltage use. The nMOS transistors 37 to 39 are constituting the current sources, respectively.

According to the semiconductor integrated circuit device of the fourth embodiment, the level-shift current is controlled to suppress the consumption of electric current as compared to that of the conventional circuit and, besides, the high-speed operation is accomplished by suppressing the gain. Further, the level-shifting unit 50 employs normal transistors (for low-voltage use) except the input transistors 35 and 36. Even when the power-source voltage is lowered, therefore, the transistors for low-voltage use can maintain the gate-source voltage Vgs to a sufficient degree owing to their low threshold voltage Vth, making it possible to accomplish a high-speed operation.

Figure 10:
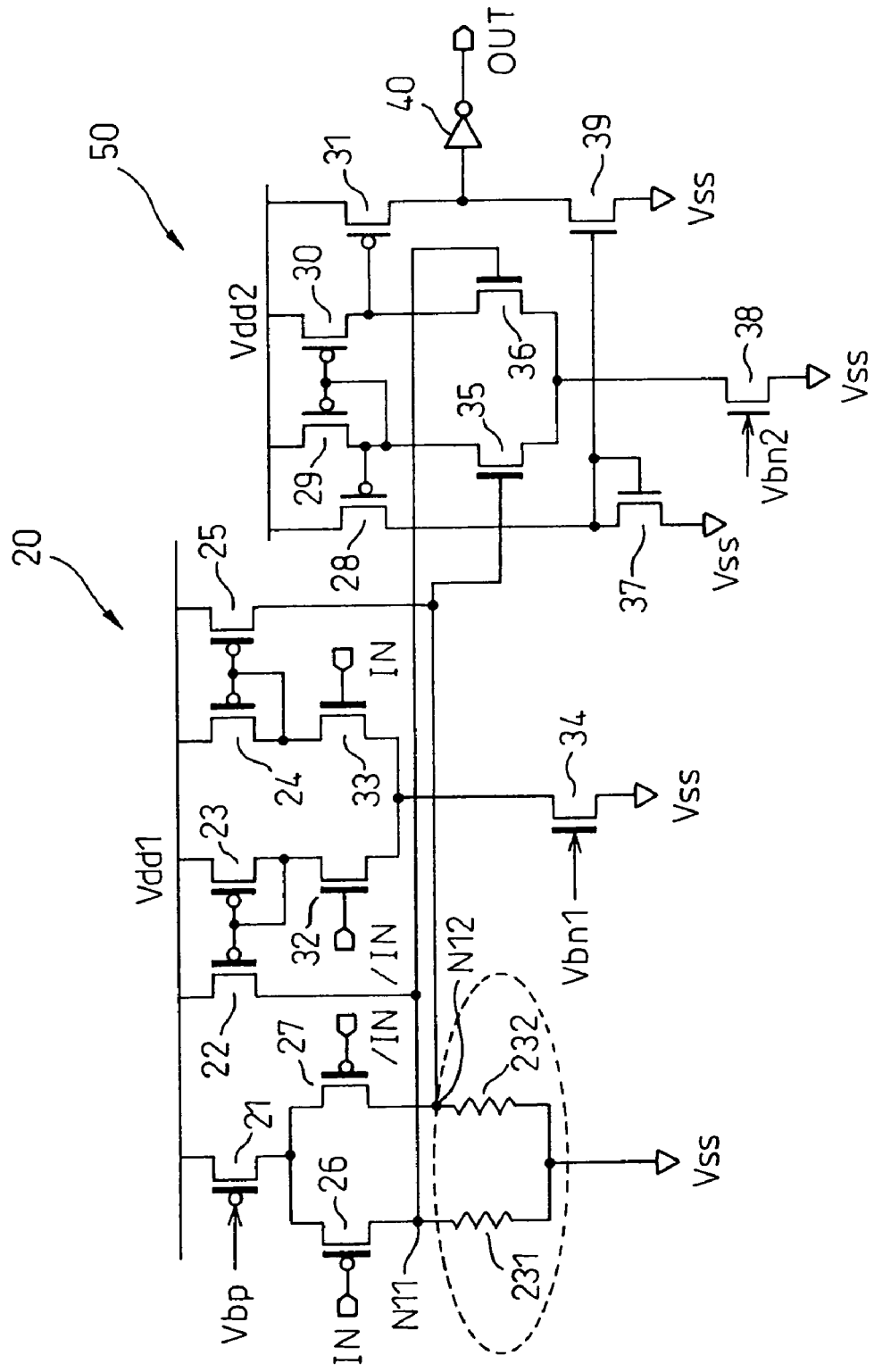
FIG. 10 is a circuit diagram illustrating the semiconductor integrated circuit device according to a fifth embodiment of the present invention.

FIG. 10 is a circuit diagram illustrating the semiconductor integrated circuit device according to a fifth embodiment of the present invention. As will be obvious from the comparison of FIG. 9 with FIG. 10, the semiconductor integrated circuit device of the fifth embodiment shown in FIG. 10 employs resistors 231 and 232 instead of the nMOS transistors 221 and 222 that are diode-connected in the fourth embodiment shown in FIG. 9. Namely, the voltages at nodes N11 and N12 need not be set to be higher than the lower high-potential power-source voltage Vdd2. Upon replacing the transistors 221 and 222 of the fourth embodiment by the resistors 231 and 232, therefore, the gain is prevented from increasing too much, and there is realized a circuit that operates at a higher speed.

Figure 11:
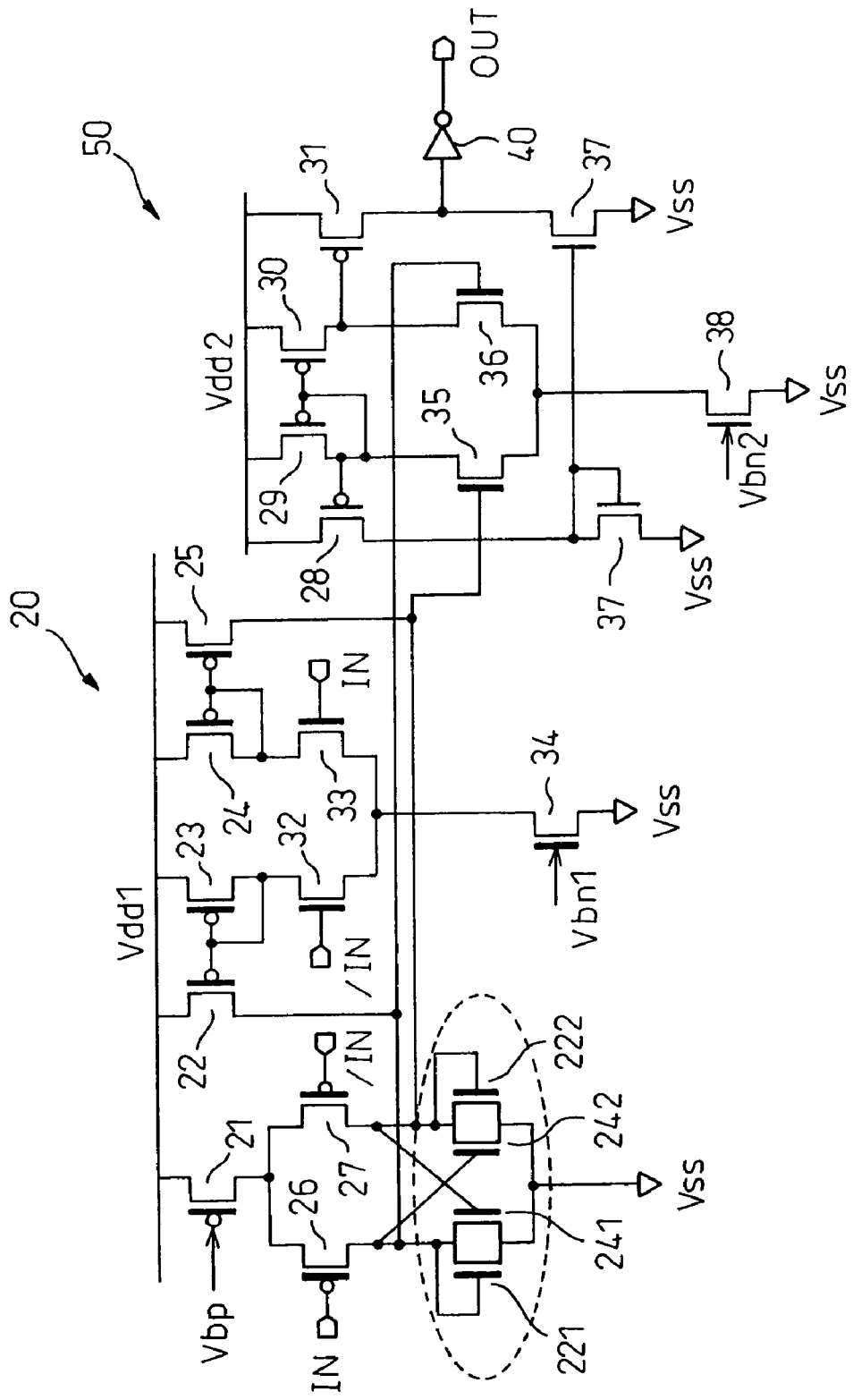
FIG. 11 is a circuit diagram illustrating the semiconductor integrated circuit device according to a sixth embodiment of the present invention.

FIG. 11 is a circuit diagram illustrating the semiconductor integrated circuit device according to a sixth embodiment of the present invention. As will be obvious from the comparison of FIG. 9 with FIG. 11, the semiconductor integrated circuit device of the sixth embodiment shown in FIG. 11 employs cross-coupled nMOS transistors 241 and 242 in addition to the diode-connected nMOS transistors 221 and 222 employed in the fourth embodiment shown in FIG. 9, in order to increase the gain. Namely, the semiconductor integrated circuit device of the sixth embodiment can be effectively used when, for example, the gain of the circuit of the fourth embodiment of FIG. 9 is not large enough.

Figure 12:
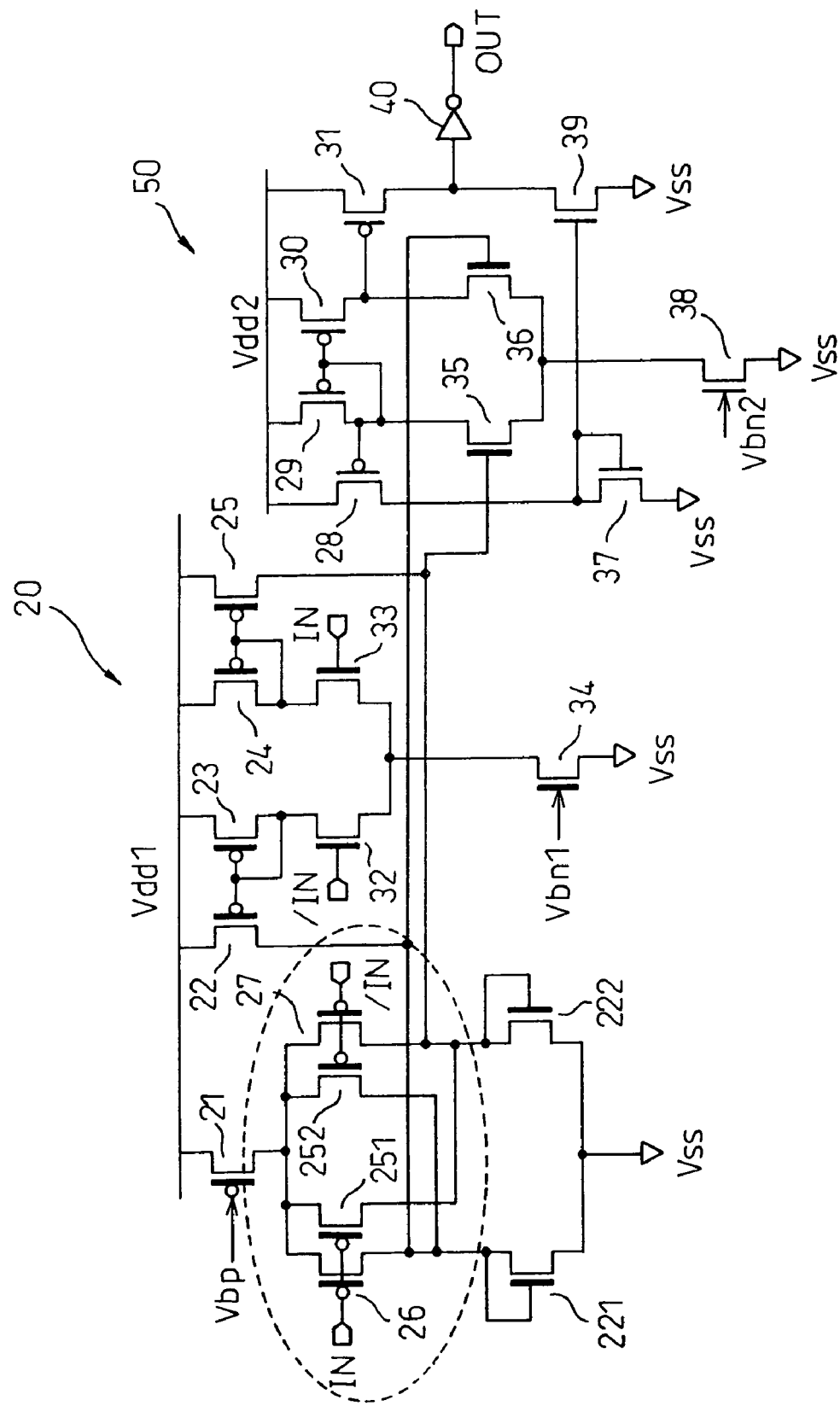
FIG. 12 is a circuit diagram illustrating the semiconductor integrated circuit device according to a seventh embodiment of the present invention.

FIG. 12 is a circuit diagram illustrating the semiconductor integrated circuit device according to a seventh embodiment of the present invention. As will be obvious from the comparison of FIG. 9 with FIG. 12, the semiconductor integrated circuit device of the seventh embodiment shown in FIG. 12 employs cross-coupled nMOS transistors 251 and 252 that receive input signals IN, /IN in addition to the pMOS transistors 26 and 27 in the circuit of the fourth embodiment of FIG. 9, in order to increase the speed of inverting the transistors and to accomplish a higher operation speed. That is, in the above fourth embodiment of FIG. 9, when the input signal IN has the low level "L" and the input signal /IN has the high level "H", a current flows through the transistors 26 and 221 but does not flow through the transistors 27 and 222. In the seventh embodiment, however, since the drain of the transistor 251 that is turned on has been connected to the drain of the transistor 27, there is established a current path permitting the current to flow even through the transistors 27 and 222. Contrary to the case described above with reference to FIG. 4, therefore, the gates of the transistors 36 and 35 in the level-shifting unit 50 receive a voltage which is ahead of the threshold voltage Vth, realizing the operation at a higher speed.

Figure 13:
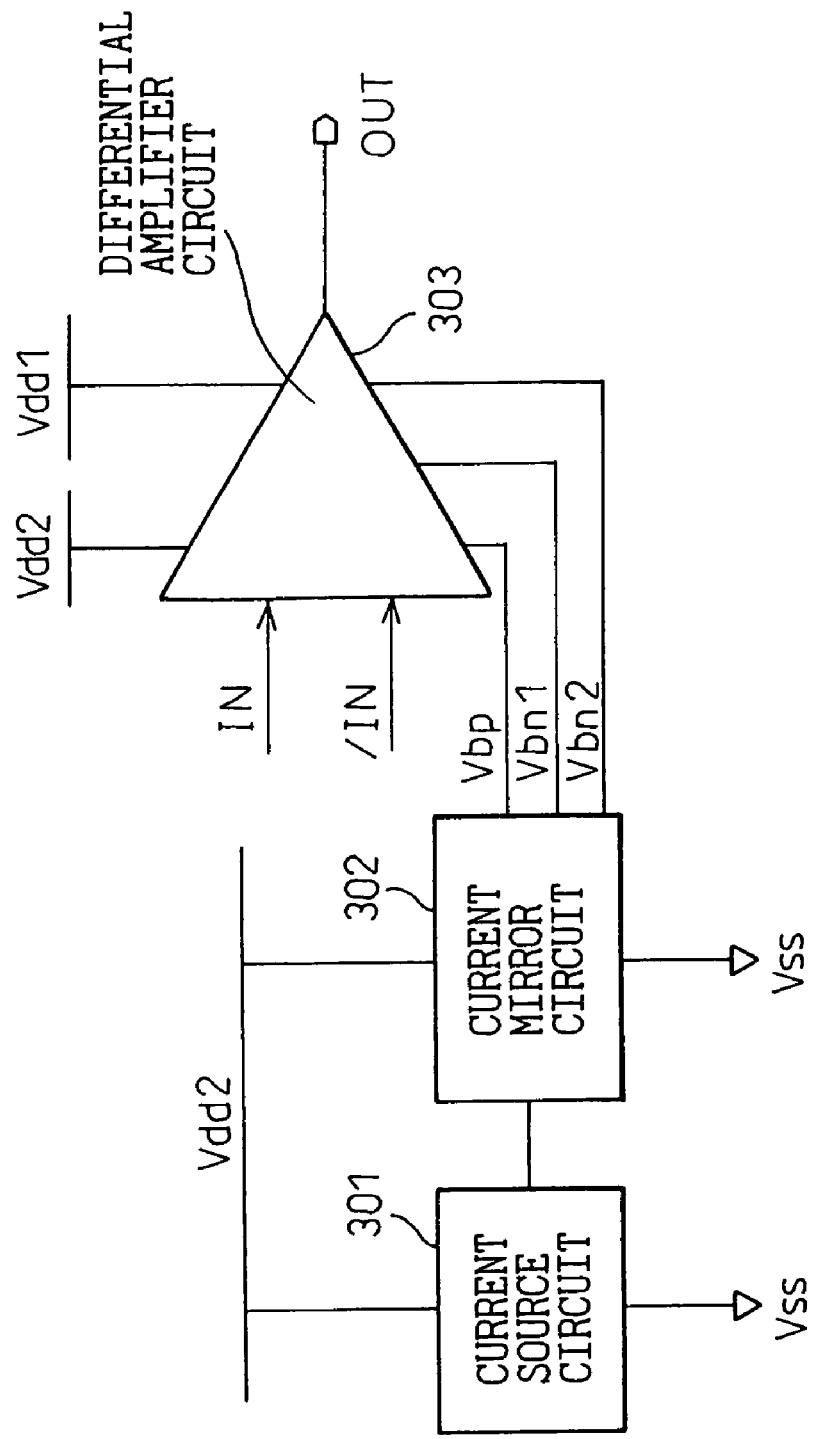
FIG. 13 is a circuit diagram illustrating the semiconductor integrated circuit device according to an eighth embodiment of the present invention.

FIG. 13 is a circuit diagram illustrating the semiconductor integrated circuit device according to an eighth embodiment of the present invention.

In FIG. 13, a current-source circuit 301 is the one to which is applied the semiconductor integrated circuit device of first to third embodiments (current-source circuit) of the invention described with reference to FIGS. 5 to 8, and a differential amplifier circuit 303 is the one to which is applied the semiconductor integrated circuit device of fourth to seventh embodiments (differential amplifier circuit having a level-shifting function) of the invention described with reference to FIGS. 9 to 12.

Figure 14:
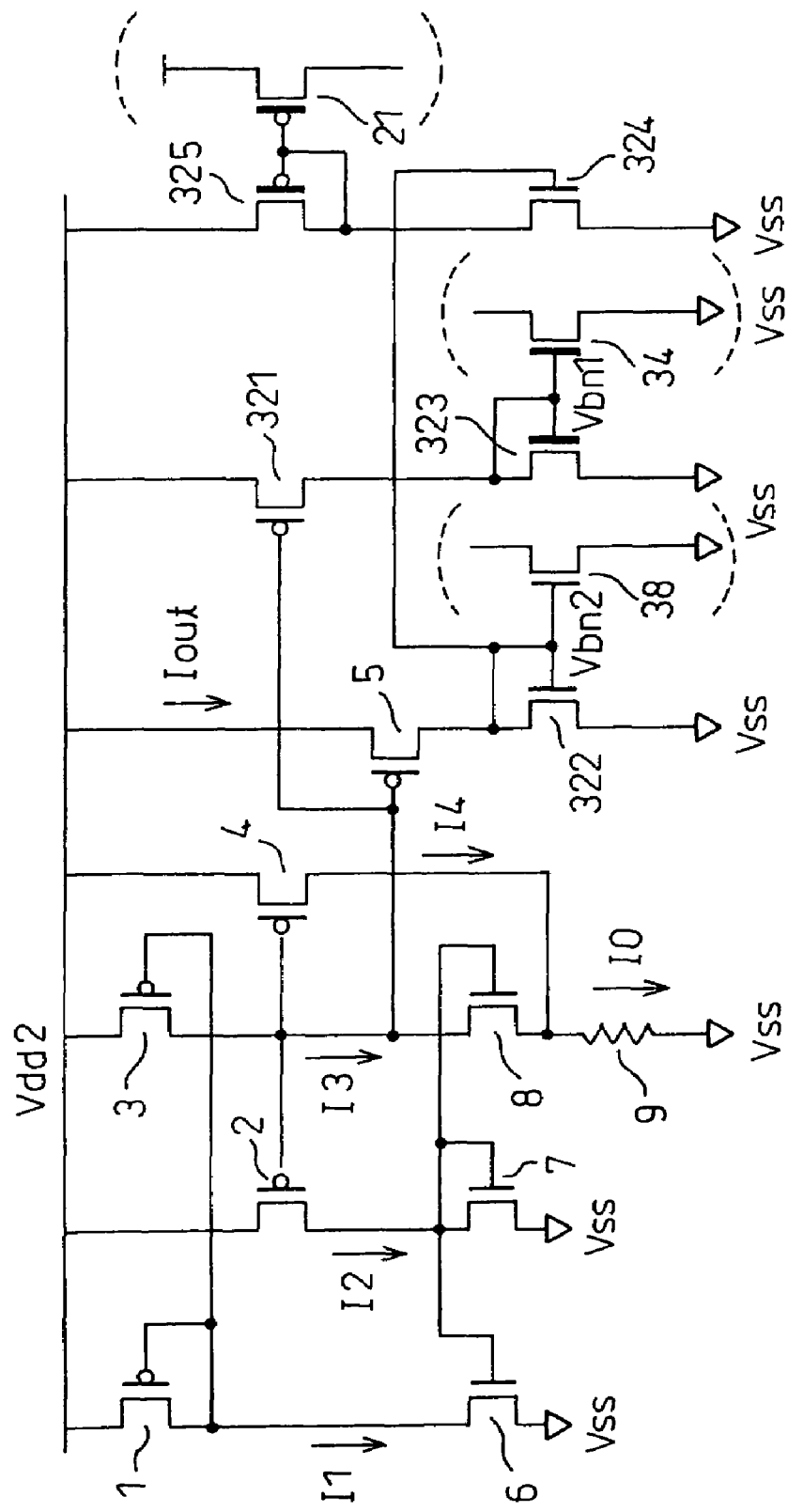
FIG. 14 is a diagram illustrating a portion of the circuit in the semiconductor integrated circuit device shown in FIG. 13.

FIG. 14 is a diagram illustrating a portion of the circuit in the semiconductor integrated circuit device shown in FIG. 13, and wherein the first embodiment (pMOS transistors 1 to 5, nMOS transistors 6 to 8, and resistor 9) shown in FIG. 5 is applied as the current-source circuit 301, and pMOS transistors 321, 325 and nMOS transistors 322, 323, 324 are applied as the current mirror circuit 302.

Referring to FIG. 14, a high-voltage nMOS transistor 323 current mirror-connected to the transistor 34 is arranged between the drain of the pMOS transistor 321 and the low-potential power-source line (Vss) in order to apply a bias voltage Vbn1 to the gate of the high-voltage nMOS transistor 34 in the differential amplifier circuit 303, a low-voltage nMOS transistor 322 current mirror-connected to the transistor 38 is arranged between the drain of the pMOS transistor 5 and the low-potential power-source line (Vss) in order to apply a bias voltage Vbn2 to the gate of the low-voltage nMOS transistor 38, and a high-voltage pMOS transistor 325 current mirror-connected to the transistor 21 is arranged between the drain of the nMOS transistor 324 and the high-potential power-source line (Vdd) in order to apply a bias voltage Vbp to the gate of the high-voltage pMOS transistor 21. In the semiconductor integrated circuit device shown in FIG. 14, the first embodiment shown in FIG. 5 is applied as the current-source circuit 301. However, it needs not be pointed that any other embodiment can also be applied and, besides, various circuits can be applied even to the current mirror circuit 302 and to the differential amplifier circuit 303.

As described above, the semiconductor integrated circuit device of the eighth embodiment of the present invention is capable of sufficiently coping with even the input signals of high frequencies by stabilizing the current source in the differential amplifier circuit 303.

As described above, the current-source circuit (semiconductor integrated circuit device) according to the invention is not almost affected by the power-source voltage, is little affected by the temperature, and makes it possible to provide a stable current source to cope with a decreased power-source voltage that stems from the modern finely fabricated transistors. Further, the differential amplifier circuit (semiconductor integrated circuit device) according to the invention can cope with a common level of input at high frequencies and over a wide range and, further, imparts a function for shifting the output level into a logic voltage value. Upon combining the current-source circuit with the differential amplifier circuit of the present invention, it is allowed to provide a semiconductor integrated circuit device which copes with high frequencies more stably.

According to the present invention as described above in detail, it is allowed to provide a semiconductor integrated circuit device which is capable of producing a stabilized current without almost affected by the power-source voltage or the temperature. According to the present invention, further, there is provided a semiconductor integrated circuit device having a level-shifting function which is capable of coping with high-frequency inputs of small amplitudes over a wide range, and of converting the input signals into signals of a predetermined logic voltage.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit device comprising:
   an amplifier unit connected between a first power-source line and a second power-source line; and
   a level-shifting unit connected between a third power-source line and said second power-source line, wherein:
   said amplifier unit includes diode-connected first and second transistors, and third and fourth transistors, said third transistor being connected in parallel with said first transistor and said fourth transistor being connected in parallel with said second transistor;
   said level-shifting unit includes fifth and sixth transistors; and
   a drain of said first transistor is connected to gates of said fourth and fifth transistors, and a drain of said second transistor is connected to gates of said third and sixth transistors.

2. The semiconductor integrated circuit device as claimed in claim 1, wherein:
   said amplifier unit receives differential input signals.

3. The semiconductor integrated circuit device as claimed in claim 1, wherein said amplifier unit receives differential signals and outputs signals, voltage levels of which are converted into a voltage of the drain of said first transistor and a voltage of the drain of said second transistor in accordance with said first and second transistors.

4. The semiconductor integrated circuit device as claimed in claim 1, wherein said fifth and sixth transistors are transistors for high-voltage use.

5. The semiconductor integrated circuit device as claimed in claim 1, wherein said first, second, third, fourth, fifth and sixth transistors have the same conductivity type.

6. The semiconductor integrated circuit device as claimed in claim 1, wherein said level-shifting unit includes low-voltage transistors except for said fifth and sixth transistors.

7. The semiconductor integrated circuit device as claimed in claim 6, wherein said low-voltage transistors receives a signal having a voltage lower than a maximum voltage which is applied to said first and second transistors.

* * * * *

UNITED STATES PATENT AND TRADEMARK OFFICE
CERTIFICATE OF CORRECTION

PATENT NO.       : 7,659,766 B2                                           Page 1 of 1
APPLICATION NO.  : 11/004807
DATED            : February 9, 2010
INVENTOR(S)      : Ishida et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 825 days.

Signed and Sealed this

Twenty-eighth Day of December, 2010

David J. Kappos
*Director of the United States Patent and Trademark Office*